United States Patent
Kurita et al.

(10) Patent No.: US 10,184,179 B2
(45) Date of Patent: Jan. 22, 2019

(54) ATOMIC LAYER DEPOSITION PROCESSING CHAMBER PERMITTING LOW-PRESSURE TOOL REPLACEMENT

(71) Applicant: Applied Materials, Inc., Santa Clara, CA (US)

(72) Inventors: Shinichi Kurita, San Jose, CA (US); Jozef Kudela, Morgan Hill, CA (US); John M. White, Hayward, CA (US); Dieter Haas, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 263 days.

(21) Appl. No.: 15/107,878

(22) PCT Filed: Jan. 20, 2015

(86) PCT No.: PCT/US2015/011945
§ 371 (c)(1),
(2) Date: Jun. 23, 2016

(87) PCT Pub. No.: WO2015/112467
PCT Pub. Date: Jul. 30, 2015

(65) Prior Publication Data
US 2016/0362788 A1 Dec. 15, 2016

Related U.S. Application Data

(60) Provisional application No. 62/076,342, filed on Nov. 6, 2014, provisional application No. 62/075,794, filed
(Continued)

(51) Int. Cl.
*C23C 16/455* (2006.01)
*H01L 51/56* (2006.01)
(Continued)

(52) U.S. Cl.
CPC ...... *C23C 16/45548* (2013.01); *C23C 16/042* (2013.01); *C23C 16/4402* (2013.01);
(Continued)

(58) Field of Classification Search
CPC .............................................. C23C 16/45565
See application file for complete search history.

(56) References Cited

U.S. PATENT DOCUMENTS

2005/0268856 A1 12/2005 Miller et al.
2007/0163716 A1* 7/2007 Hsiao ................ C23C 16/45565
156/345.26
(Continued)

FOREIGN PATENT DOCUMENTS

CN 101916715 A 12/2010
CN 102246286 A 11/2011
(Continued)

OTHER PUBLICATIONS

International Search Report and Written Opinion, PCT/US2015/011956, dated Apr. 28, 2015.
(Continued)

*Primary Examiner* — Joseph A Miller, Jr.
(74) *Attorney, Agent, or Firm* — Patterson & Sheridan, LLP

(57) ABSTRACT

The present disclosure relates to methods and apparatus for an atomic layer deposition (ALD) processing chamber for device fabrication and methods for replacing a gas distribution plate and mask of the same. The ALD processing chamber has a slit valve configured to allow removal and replacement of a gas distribution plate and mask. The ALD processing chamber may also have actuators operable to move the gas distribution plate to and from a process position and a substrate support assembly operable to move the mask to and from a process position.

20 Claims, 6 Drawing Sheets

Related U.S. Application Data on Nov. 5, 2014, provisional application No. 61/929,786, filed on Jan. 21, 2014.

(51) Int. Cl.

| | |
|---|---|
| H01L 21/67 | (2006.01) |
| H01L 21/677 | (2006.01) |
| H01L 21/687 | (2006.01) |
| C23C 16/04 | (2006.01) |
| C23C 16/44 | (2006.01) |
| C23C 16/54 | (2006.01) |
| H01J 37/32 | (2006.01) |
| H01L 51/52 | (2006.01) |
| H01L 51/00 | (2006.01) |

(52) U.S. Cl.
CPC .......... *C23C 16/54* (2013.01); *H01J 37/3244* (2013.01); *H01J 37/32467* (2013.01); *H01J 37/32513* (2013.01); *H01J 37/32715* (2013.01); *H01J 37/32834* (2013.01); *H01J 37/32853* (2013.01); *H01L 21/6719* (2013.01); *H01L 21/67748* (2013.01); *H01L 21/67751* (2013.01); *H01L 21/68742* (2013.01); *H01L 51/5237* (2013.01); *H01L 51/5253* (2013.01); *H01L 51/56* (2013.01); *H01J 37/32082* (2013.01); *H01J 37/32899* (2013.01); *H01J 2237/327* (2013.01); *H01J 2237/3321* (2013.01); *H01L 51/0011* (2013.01)

(56) References Cited

U.S. PATENT DOCUMENTS

| | | |
|---|---|---|
| 2009/0130858 A1 | 5/2009 | Levy |
| 2010/0112212 A1 | 5/2010 | Zhang et al. |
| 2011/0223710 A1 | 9/2011 | Beck |
| 2012/0225193 A1 | 9/2012 | Yudovsky |
| 2013/0239889 A1* | 9/2013 | Lien .................. H01L 21/67126 118/715 |
| 2013/0337171 A1 | 12/2013 | Sasagawa |

FOREIGN PATENT DOCUMENTS

| | | |
|---|---|---|
| KR | 20040048441 A | 6/2004 |
| KR | 2008-0110566 A | 12/2008 |
| TW | 201241222 A | 10/2012 |
| WO | 2010/051233 A2 | 5/2010 |
| WO | 2012/174550 A2 | 12/2012 |

OTHER PUBLICATIONS

First Office Action (with attached English translation) dated Jul. 17, 2017 for Application No. 201580005071.3, The State Intellectual Property Office of the People's Republic of China, China.

International Search Report and Written Opinions, PCT/US2015/011945, dated Apr. 28, 2015.

Second Office Action (with attached English translation) dated Mar. 5, 2018 for Application No. 201580005071.3, The State Intellectual Property Office of the People's Republic of China, China.

* cited by examiner

ATOMIC LAYER DEPOSITION PROCESSING CHAMBER PERMITTING LOW-PRESSURE TOOL REPLACEMENT

BACKGROUND

Field

Embodiments of the present disclosure generally relate to an apparatus for processing large area substrates. More particularly, embodiments of the present disclosure relate to an atomic layer deposition (ALD) system for device fabrication and in situ cleaning methods for a showerhead of the same.

Description of the Related Art

Organic light emitting diodes (OLED) are used in the manufacture of television screens, computer monitors, mobile phones, other hand-held devices, etc. for displaying information. A typical OLED may include layers of organic material situated between two electrodes that are all deposited on a substrate in a manner to form a matrix display panel having pixels that may be individually energized. The OLED is generally placed between two glass panels, and the edges of the glass panels are sealed to encapsulate the OLED therein.

The OLED industry, as well as other industries that utilize substrate processing techniques, encapsulate moisture-sensitive devices to protect them from ambient moisture exposure. A thin conformal layer of material has been proposed as a means of reducing Water Vapor Transmission Rate (WVTR) through encapsulation layer(s). Currently, there are a number of commercial ways to encapsulate devices. Using an ALD process to cover a moisture-sensitive device is being considered to determine if the conformal nature of these coatings can provide a more effective moisture barrier than other coatings.

ALD is based upon atomic layer epitaxy (ALE) and employs chemisorption techniques to deliver precursor molecules on a substrate surface in sequential cycles. The cycle exposes the substrate surface to a first precursor and then to a second precursor. Optionally, a purge gas may be introduced between introductions of the precursors. The first and second precursors react to form a product compound as a film on the substrate surface. The cycle is repeated to form the layer to a desired thickness.

One method of performing ALD is by Time-Separated (TS) pulses of precursor gases. TS-ALD has several advantages over other methods, however one drawback of TS-ALD is that every surface (e.g., the interior of the chamber) exposed to the precursors will be coated with deposition. If these deposits are not removed periodically, the deposits will tend to flake and peel off eventually, leading to particulates ending up on the substrate and hence degraded moisture barrier performance of the deposited layer. If there is no effective way to clean the undesired deposits from the chamber surfaces in situ, then those chamber surfaces must be removed for cleaning "off-line". If the chamber has to be opened to accomplish removing and replacing chamber surfaces for cleaning, then vacuum has to be broken in the chamber (e.g., the chamber is brought to atmospheric pressure) and this breaking of vacuum will lead to excessive chamber down-time.

There is a need, therefore, for a processing chamber allowing for removal and cleaning of the main key elements of the chamber which will accumulate extraneous deposits with minimal down-time.

SUMMARY OF THE INVENTION

A chamber for performing an ALD process is provided. The chamber generally includes a gas distribution plate, a substrate support disposed in the chamber opposite the gas distribution plate, and at least one gas distribution plate actuator capable of moving the gas distribution plate relative to the substrate support.

In another embodiment, a processing system for performing atomic layer deposition (ALD) is provided. The processing system generally includes an ALD processing chamber, wherein pressure within the ALD processing chamber is maintained at 1 torr or less and the ALD processing chamber has a first slit valve opening configured to permit passage of ALD process tools therethrough. The processing system further includes a first slit valve operable to open and close the first slit valve opening of the ALD processing chamber, wherein the first slit valve is operable to make an air-tight seal when closed, and a transfer chamber having a first slit valve opening configured to permit passage of ALD process tools therethrough and aligned to the first slit valve opening of the ALD processing chamber.

In another embodiment, a method for replacing first process tools in an atomic layer deposition (ALD) chamber is provided. The method generally includes maintaining a pressure of 1 torr or less within the ALD chamber, opening a slit valve in the ALD chamber connected with a transfer chamber, moving the first process tools from the ALD chamber through the slit valve to the transfer chamber, and moving second process tools from the transfer chamber through the slit valve into the ALD chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
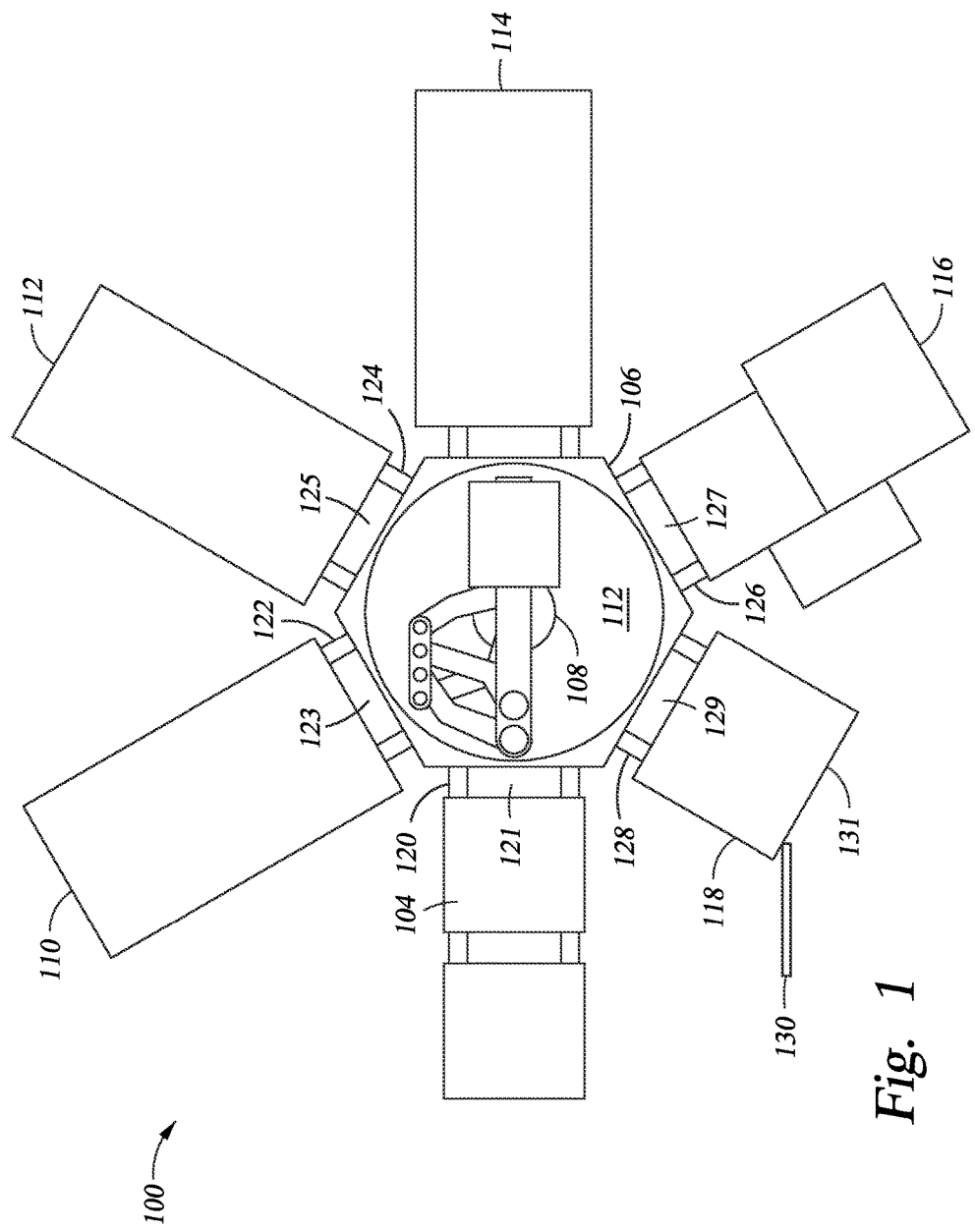
FIG. 1 illustrates an exemplary processing system, according to certain aspects of the present disclosure.

Embodiments of the present disclosure include a processing system that is operable to deposit a plurality of layers on a substrate, the plurality of layers capable of acting as an encapsulation layer on an OLED formed on the substrate. The system includes a plurality of processing chambers, with each processing chamber operable to deposit one or more of the plurality of layers. The processing system further includes at least one transfer chamber and at least one load-lock chamber. The at least one transfer chamber enables transfer of substrates between the plurality of processing chambers without breaking vacuum in the processing system. The at least one load-lock chamber enables loading and removal of substrates from the processing system without breaking vacuum in the processing system. The processing system further includes a mask chamber that enables loading and removal of masks used in the processing chambers without breaking vacuum in the processing system.

Embodiments of the disclosure include chemical vapor deposition (CVD) processing chambers that are operable to align a mask with respect to a substrate, position the mask on the substrate, and perform CVD to deposit an encapsulation layer on an OLED formed on the substrate. The CVD process performed in the CVD processing chambers may be plasma-enhanced CVD (PECVD), but the embodiments described herein may be used with other types of processing chambers and are not limited to use with PECVD processing chambers. The encapsulation layers deposited by the CVD processing chambers may comprise silicon nitride SiN, but the embodiments described herein may be used with other types of processing chambers and are not limited to use with SiN CVD processing chambers.

Embodiments of the disclosure include an ALD processing chamber that is operable to align a mask with respect to a substrate, position the mask on the substrate, and perform ALD to deposit an encapsulation layer on an OLED formed on the substrate. The ALD process performed in the ALD processing chamber may be TS-ALD, but the embodiments described herein may be used with other types of processing chambers and are not limited to use with TS-ALD processing chambers. The encapsulation layers deposited by the ALD processing chambers may comprise aluminum oxide $Al_2O_3$, but the embodiments described herein may be used with other types of processing chambers and are not limited to use with SiN CVD processing chambers.

The embodiments described herein may be used with other types of deposition processes and are not limited to use for encapsulating OLEDs formed on substrates. The embodiments described herein may be used with various types, shapes, and sizes of masks and substrates.

The substrate is not limited to any particular size or shape. In one aspect, the term "substrate" refers to any polygonal, squared, rectangular, curved or otherwise non-circular workpiece, such as a glass substrate used in the fabrication of flat panel displays, for example.

In the description that follows, the terms "gas" and "gases" are used interchangeably, unless otherwise noted, and refer to one or more precursors, reactants, catalysts, carrier gases, purge gases, cleaning gases, effluent, combinations thereof, as well as any other fluid.

FIG. 1 is a cross sectional top view showing an illustrative processing system 100, according to one embodiment of the present disclosure. The processing system 100 includes a load-lock chamber 104, a transfer chamber 106, a handling (e.g., tool and material handling) robot 108 within the transfer chamber 106, a first CVD processing chamber 110, a second CVD processing chamber 112, a control station 114, an ALD processing chamber 116, and a mask chamber 118. The first CVD processing chamber 110, second CVD processing chamber 112, ALD processing chamber 116, and each chamber's associated hardware are preferably formed from one or more process-compatible materials, such as aluminum, anodized aluminum, nickel plated aluminum, stainless steel, quartz, and combinations and alloys thereof, for example. The first CVD processing chamber 110, second CVD processing chamber 112, and ALD processing chamber 116 may be round, rectangular, or another shape, as required by the shape of the substrate to be coated and other processing requirements.

The transfer chamber 106 includes slit valve openings 121, 123, 125, 127, 129 in sidewalls adjacent to the load-lock chamber 104, first CVD processing chamber 110, second CVD processing chamber 112, ALD processing chamber 116, and mask chamber 118. The handling robot 108 is positioned and configured to be capable of inserting one or more tools (e.g., substrate handling blades) through each of the slit valve openings 121, 123, 125, 127, 129 and into the adjacent chamber. That is, the handling robot can insert tools into the load-lock chamber 104, the first CVD processing chamber 110, the second CVD processing chamber 112, the ALD processing chamber 116, and the mask chamber 118 via slit valve openings 121, 123, 125, 127, 129 in the walls of the transfer chamber 106 adjacent to each of the other chambers. The slit valve openings 121, 123, 125, 127, 129 are selectively opened and closed with slit valves 120, 122, 124, 126, 128 to allow access to the interiors of the adjacent chambers when a substrate, tool, or other item is to be inserted or removed from one of the adjacent chambers.

The transfer chamber 106, load-lock chamber 104, first CVD processing chamber 110, second CVD processing chamber 112, ALD processing chamber 116, and mask chamber 118 include one or more apertures (not shown) that are in fluid communication with a vacuum system (e.g., a vacuum pump). The apertures provide an egress for the gases within the various chambers. In some embodiments, the chambers are each connected to a separate and independent vacuum system. In still other embodiments, some of the chambers share a vacuum system, while the other chambers have separate and independent vacuum systems. The vacuum systems can include vacuum pumps (not shown) and throttle valves (not shown) to regulate flows of gases through the various chambers.

Masks, mask frames, and other items placed within the first CVD chamber 110, second CVD chamber 112, and ALD processing chamber 116, other than substrates, may be referred to as a "process kit." Process kit items may be removed from the processing chambers for cleaning or replacement. The transfer chamber 106, mask chamber 118, first CVD processing chamber 110, second CVD processing chamber 112, and ALD processing chamber 116 are sized and shaped to allow the transfer of masks, mask frames, and other process kit items between them. That is, the transfer chamber 106, mask chamber 118, first CVD processing chamber 110, second CVD processing chamber 112, and ALD processing chamber 116 are sized and shaped such that any process kit item can be completely contained within any one of them with all of the slit valve openings 121, 123, 125, 127, 129 closed by each slit valve opening's 121, 123, 125, 127, 129 corresponding slit valve 120, 122, 124, 126, 128. Thus, process kit items may be removed and replaced without breaking vacuum of the processing system, as the mask chamber 118 acts as an airlock, allowing process kit items to be removed from the processing system without breaking vacuum in any of the chambers other than the mask chamber. Furthermore, the slit valve opening 129 between the transfer chamber 106 and the mask chamber 118, the slit valve openings 123, 125 between the transfer chamber 106 and the CVD processing chambers 110, 112, and the slit valve opening 127 between the transfer chamber 106 and the ALD processing chamber 116 are all sized and shaped to allow the transfer of process kit items between the transfer chamber 106 and the mask chamber 118, CVD processing chambers 110, 112, and ALD processing chamber 116.

The mask chamber 118 has a door 130 and doorway 131 on the side of the mask chamber 118 opposite the slit valve opening 129 of the transfer chamber 106. The doorway is sized and shaped to allow the transfer of masks and other process tools into and out to the mask chamber 118. The door 130 is capable of forming an air-tight seal over the doorway 131 when closed. The mask chamber 118 is sized and shaped to allow any process kit item to be completely contained within the mask chamber 118 with both the door 130 closed and the slit valve 128 leading to the transfer chamber 106 closed. That is, the mask chamber 118 is sized and shaped such that any process kit item can be moved from the transfer chamber 106 into the mask chamber 118 and the slit valve 128 can be closed without the door 130 of the mask chamber 118 being opened.

For simplicity and ease of description, an exemplary coating process performed within the processing system 100 will now be described. The exemplary coating process is controlled by a process controller, which may be a computer or system of computers that may be located at the control station 114.

Referring to FIG. 1, the exemplary processing of a substrate optionally begins with the handling robot 108 retrieving a mask from the mask chamber 118 and placing the mask in the ALD processing chamber 116. Placing a mask in the ALD processing chamber 116 is optional because a mask may be left in the ALD processing chamber 116 from earlier processing, and the same mask may be used in processing multiple substrates. Similarly, the handling robot 108 may optionally retrieve other masks from the mask chamber 118 and place the masks in the first and second CVD processing chambers 110 and 112. In placing masks within the first and second CVD processing chambers 110, 112 and the ALD processing chamber 116, the appropriate slit valves 122, 124, 126, 128 between the chambers may be opened and closed.

Next, the handling robot 108 retrieves a substrate from the load-lock 104 and places the substrate in the first CVD processing chamber 110. The process controller controls valves, actuators, and other components of the processing chamber to perform the CVD processing. The process controller causes the slit valve 122 to be closed, isolating the first CVD processing chamber 110 from the transfer chamber 106. The process controller also causes a substrate support member, or susceptor, to position the substrate for CVD processing. If the mask was not placed into the correct processing position by the handling robot, then the process controller may activate one or more actuators to position the mask. Alternatively or additionally, the susceptor may also position the mask for processing. The mask is used to mask off certain areas of the substrate and prevent deposition from occurring on those areas of the substrate.

The process controller now activates valves to start the flow of precursor and other gases into the first CVD processing chamber. The precursor gases may include silane $SiH_4$, for example. The process controller controls heaters, plasma discharge components, and the flow of gases to cause the CVD process to occur and deposit layers of materials on the substrate. In one embodiment, the deposited layer may be silicon nitride (SiN), although embodiments of the disclosure are not limited to SiN. Other suitable materials include SiO, SiON, and combinations thereof. As noted above, embodiments of the disclosure may also be used to perform PECVD. The CVD process in the exemplary processing of the substrate is continued until the deposited layer reaches the desired thickness. In one exemplary embodiment, the desired thickness is 5000 to 10000 Angstroms (500 to 1000 nm).

When the CVD process in the first CVD processing chamber 110 is complete, the process controller causes the first CVD processing chamber 110 to be evacuated and then controls the susceptor to lower the substrate to a transfer position. The process controller also causes the slit valve 122 between the first CVD processing chamber 110 and the transfer chamber 106 to be opened and then directs the handling robot 108 to retrieve the substrate from the first CVD processing chamber 110. The process controller then causes the slit valve 122 between first CVD processing chamber 110 and the transfer chamber 106 to be closed.

Next, the process controller causes the slit valve 126 between the transfer chamber 106 and the ALD processing chamber 116 to be opened. The handling robot 108 places the substrate in the ALD processing chamber 116, and the process controller causes the slit valve 126 between the transfer chamber 106 and the ALD processing chamber 116 to be closed. The process controller also causes a substrate support member, or susceptor, to position the substrate for ALD processing. If the mask was not placed into the correct processing position by the handling robot, then the process controller may activate one or more actuators to position the mask. Alternatively or additionally, the susceptor may position the mask for processing. The mask is used to mask off certain areas of the substrate and prevent deposition from occurring on those areas of the substrate.

The process controller now activates valves to start the flow of precursor and other gases into the ALD processing chamber 116. The particular gas or gases that are used depend upon the process or processes to be performed. The gases can include trimethylaluminium $(CH_3)_3Al$ (TMA), nitrogen $N_2$, and oxygen $O_2$, however, the gases are not so limited and may include one or more precursors, reductants, catalysts, carriers, purge gases, cleaning gases, or any mixture or combination thereof. The gases may be introduced into the ALD processing chamber 116 from one side and flow across the substrate. Depending on requirements of the processing to be performed, the process controller may control valves such that only one gas is introduced into the ALD processing chamber 116 at any particular instant of time.

The process controller also controls a power source capable of activating the gases into reactive species and maintaining the plasma of reactive species to cause the reactive species to react with and coat the substrate. For example, radio frequency (RF) or microwave (MW) based power discharge techniques may be used. The activation may also be generated by a thermally based technique, a gas breakdown technique, a high intensity light source (e.g., UV energy), or exposure to an x-ray source. In the exemplary process, oxygen is activated into a plasma, and the plasma reacts with and deposits a layer of oxygen on the substrate. The process controller then causes TMA to flow across the substrate, and the TMA reacts with the layer of oxygen on the substrate, forming a layer of aluminum oxide on the substrate. The process controller causes repetition of the steps of flowing oxygen, activating oxygen into a plasma, and flowing TMA to form additional layers on the substrate. The process controller continues repeating the described steps until the deposited layer of aluminum oxide is the desired thickness. In one exemplary embodiment, the desired thickness is 500 to 700 Angstroms (fifty to seventy nm).

When the ALD process in the ALD processing chamber 116 is complete, the process controller causes the ALD processing chamber 116 to be evacuated and then controls the susceptor to lower the substrate to a transfer position. The process controller also causes the slit valve 126 between the ALD processing chamber 116 and the transfer chamber 106 to be opened and then directs the handling robot 108 to retrieve the substrate from the ALD processing chamber 116. The process controller then causes the slit valve 126 between ALD processing chamber 116 and the transfer chamber 106 to be closed.

Still referring to FIG. 1, next, the process controller causes the slit valve 124 between the transfer chamber 106 and the second CVD processing chamber 112 to be opened. The handling robot 108 places the substrate in the second CVD processing chamber 112, and the process controller causes the slit valve 124 between the transfer chamber 106 and the second CVD processing chamber 112 to be closed. Processing in the second CVD processing chamber 112 is similar to the processing in the first CVD processing chamber 110 described above. In the exemplary processing of the substrate, the CVD process performed in the second CVD processing chamber 112 is continued until the deposited layer reaches the desired thickness. In one exemplary embodiment, the desired thickness is 5000 to 10000 Angstroms (500 to 1000 nm).

Thus, when the process in the second CVD processing chamber 112 is complete, the substrate will be coated with a first layer of SiN that is 5000 to 10000 Angstroms thick, a layer of $Al_2O_3$ that is 500 to 700 Angstroms thick, and a second layer of SiN that is 5000 to 10000 Angstroms thick. The layer of $Al_2O_3$ is believed to lower the water vapor transfer rate through the encapsulation layer, as compared to SiN alone, thus improving the reliability of the encapsulation, as compared to encapsulating with SiN alone.

In the exemplary process described above with reference to FIG. 1, each of the CVD processing chambers 110, 112 and the ALD processing chamber 116 is loaded with a mask. Alternatively, the processing system 100 may perform a process wherein a mask moves with a substrate from processing chamber to processing chamber. That is, in a second exemplary process, a substrate and mask are placed (simultaneously or individually) in the first CVD processing chamber 110, and the slit valve 122 between the transfer chamber 106 and the first processing chamber 110 is closed. A CVD process is then performed on the substrate. The substrate and mask are then moved (simultaneously or individually) into the ALD processing chamber 116, and the slit valve 126 between the transfer chamber and the ALD processing chamber 116 is closed. An ALD process is then performed on the substrate. The substrate and mask are then moved (simultaneously or individually) into the second CVD processing chamber 112. A CVD process is then performed on the substrate, and the substrate and mask are then removed from the second CVD processing chamber 112. The substrate may be removed from the processing system 100, if complete, and the mask may be used for processing a new substrate or removed from the processing system 100 for cleaning, for example.

Figure 2:
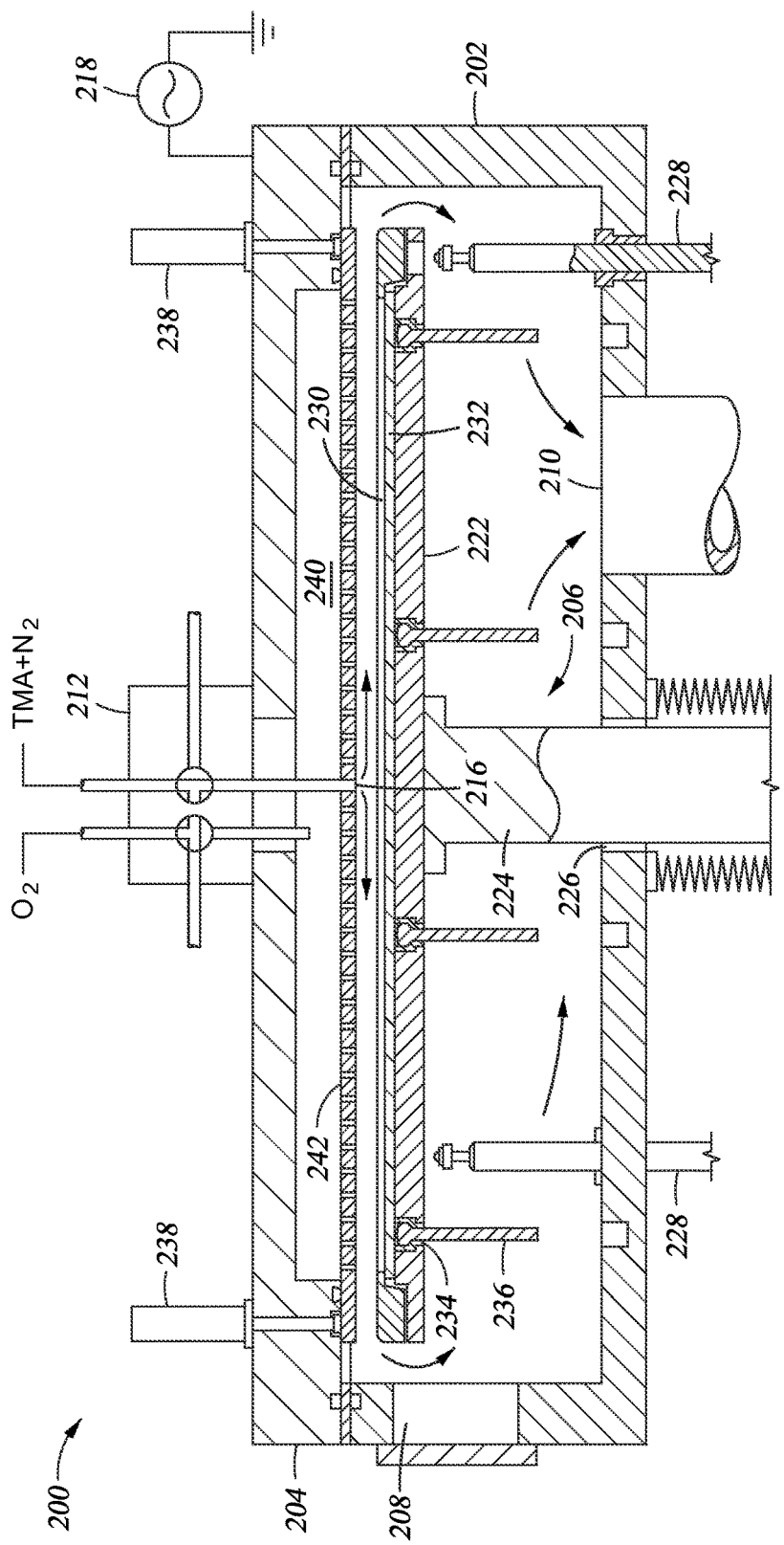
FIG. 2 illustrates an exemplary chamber for ALD, according to certain aspects of the present disclosure.

FIG. 2 is a partial cross sectional view showing an illustrative ALD processing chamber 200 with components in position for processing. The ALD processing chamber shown in FIG. 2 is highly similar to the ALD processing chamber 116 shown in FIG. 1. In one embodiment, the processing chamber 200 includes a chamber body 202, a lid assembly 204, and a substrate support assembly 206. The lid assembly 204 is disposed at an upper end of the chamber body 202, and the substrate support assembly 206 is at least partially disposed within the chamber body 202.

The chamber body 202 includes a slit valve opening 208 formed in a sidewall thereof to provide access to the interior of the processing chamber 100. As described above with reference to FIG. 1, the slit valve opening 208 is selectively opened and closed to allow access to the interior of the chamber body 202 by a handling robot (see FIG. 1).

In one or more embodiments, the chamber body 202 includes one or more apertures 210 that are in fluid communication with a vacuum system (e.g., a vacuum pump). The apertures provide an egress for the gases within the processing chamber. The vacuum system is controlled by a process controller to maintain a pressure within the ALD processing chamber suitable for the ALD process. In one embodiment of the present disclosure, the pressure in the ALD processing chamber is maintained at a pressure of 500 to 700 mTorr.

The processing chamber 200 may include a valve block assembly 212. The valve block assembly comprises a set of valves and controls the flow of the various gases into the processing chamber 200. The lid assembly 204 may comprise a plenum 240 above the gas distribution plate or showerhead 242. Process gases, oxygen for example, may flow into the plenum 240 before flowing through the showerhead 242 into the processing chamber 200. The showerhead 242 may comprise any number of openings (i.e., holes) of consistent or varying sizes, according to the processing requirements. Other precursor gases, trimethylaluminium and nitrogen for example, may flow through and be distributed from the central opening 216.

Still referring to FIG. 2, the lid assembly 204 can further act as an electrode to generate a plasma of reactive species within the lid assembly 204. In one or more embodiments, the electrode is coupled to a power source (e.g., an RF generator) 218 while a gas delivery assembly is connected to ground (i.e., the gas delivery assembly serves as an electrode). Accordingly, a plasma of one or more process gases can be generated between the gas delivery assembly and a substrate support member or susceptor 222. Additionally or alternatively, the plasma may be struck and contained between the susceptor 222 and the showerhead 242.

Any power source capable of activating the gases into reactive species and maintaining the plasma of reactive species may be used. For example, radio frequency (RF) or microwave (MW) based power discharge techniques may be used. The activation may also be generated by a thermally based technique, a gas breakdown technique, a high intensity light source (e.g., UV energy), or exposure to an x-ray source.

Still referring to FIG. 2, the substrate support assembly 206 can be at least partially disposed within the chamber body 202. The substrate support assembly can include a substrate support member or susceptor 222 to support a substrate 232 for processing within the chamber body. The susceptor 222 can be coupled to a substrate lift mechanism (not shown) through a shaft 224 or shafts 224 which extend through one or more openings 226 formed in a bottom surface of the chamber body. The substrate lift mechanism can be flexibly sealed to the chamber body by a bellows (not shown) that prevents vacuum leakage from around the shafts. The substrate lift mechanism allows the susceptor to be moved vertically within the chamber body between a process position, as shown, and lower robot entry, mask removal, showerhead removal, and substrate transfer positions. The susceptor is in the substrate transfer position when the upper surface of the susceptor is slightly below the opening of the slit valve formed in a sidewall of the chamber body.

Figure 5:
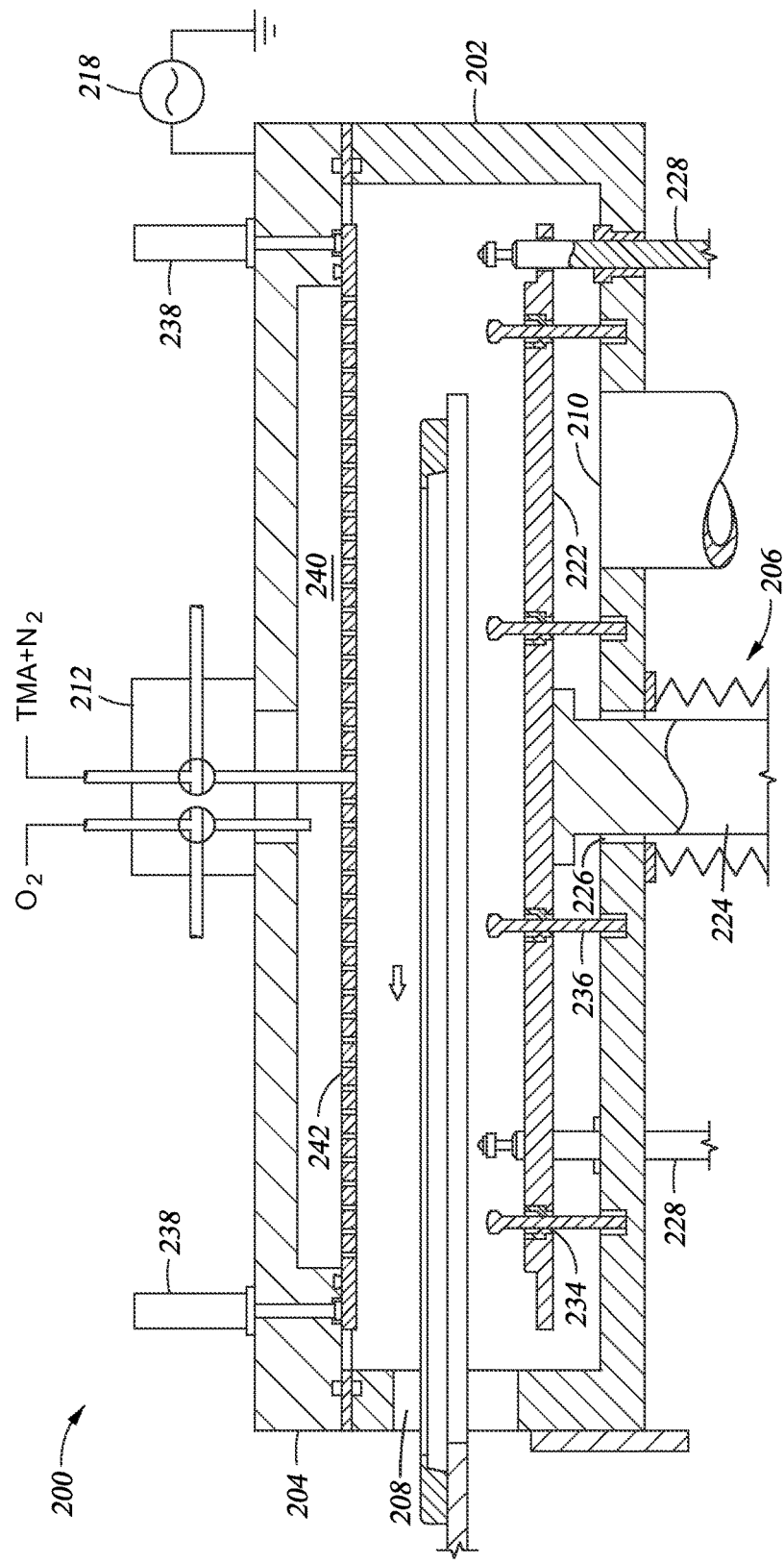
FIG. 5 illustrates an exemplary chamber for ALD, with components in a position in preparation for cleaning, according to certain aspects of the present disclosure.
Figure 6:
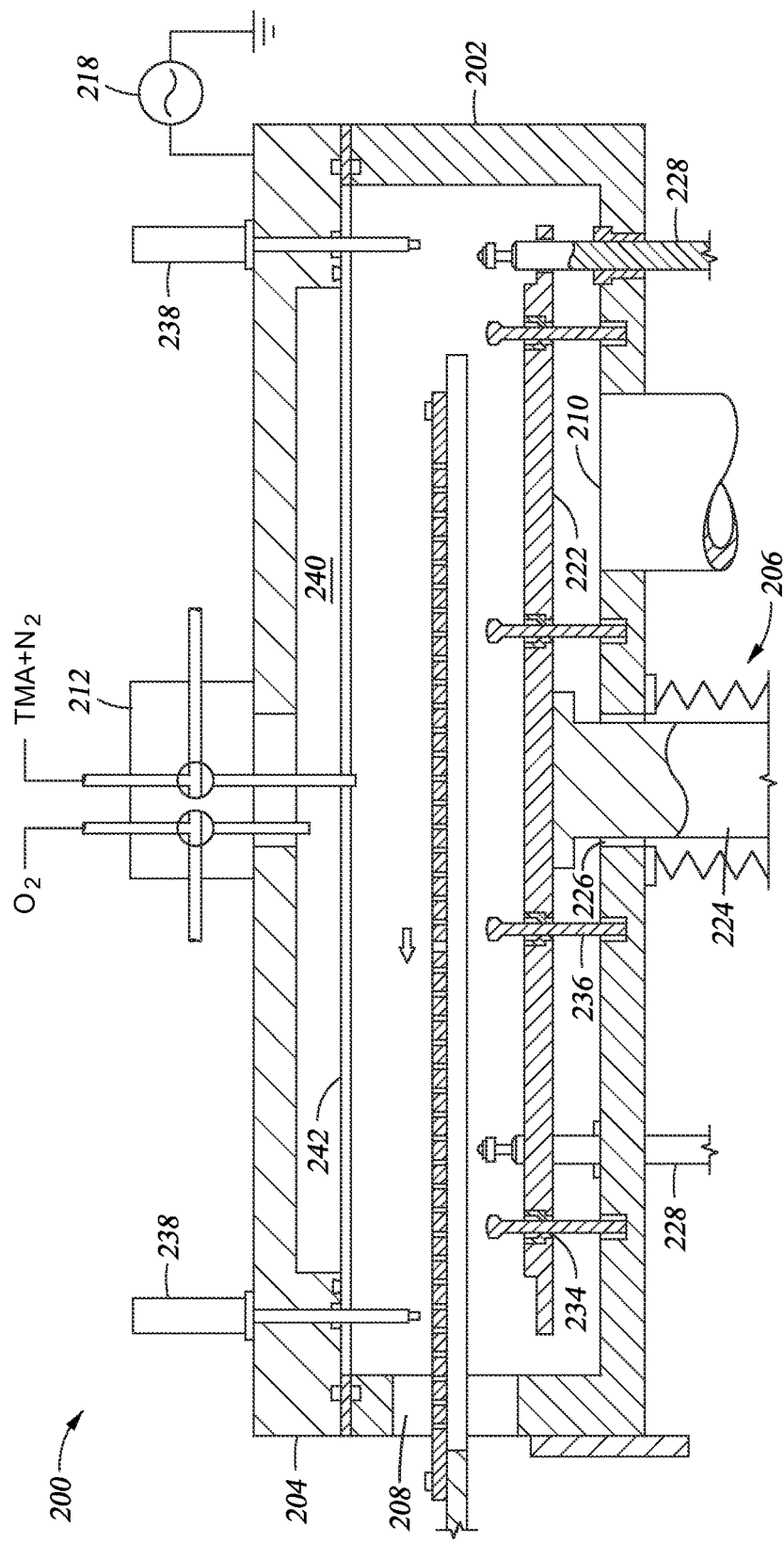
FIG. 6 illustrates an exemplary chamber for ALD, with components in a position in preparation for cleaning, according to certain aspects of the present disclosure.

A mask 230 may be positioned over the substrate 232 during processing to control the locations of the deposition, depending on production requirements. The processing chamber 200 may further comprise a plurality of mask alignment shafts 228. When the substrate support assembly 206 is lowered, the mask may come to rest on the mask alignment shafts, as shown in FIGS. 5 and 6. The mask alignment shafts may be coupled to a mask lift mechanism (not shown), which may raise and lower the mask alignment shafts when the mask is removed or replaced (e.g., for cleaning or changing the mask).

In one or more other embodiments, the susceptor 222 has a flat, rectangular surface or a substantially flat, rectangular surface, as required by the shape of the substrate and other processing requirements. In one or more embodiments, the substrate 232 may be secured to the susceptor using a vacuum chuck (not shown), an electrostatic chuck (not shown), or a mechanical clamp (not shown).

Figure 4:
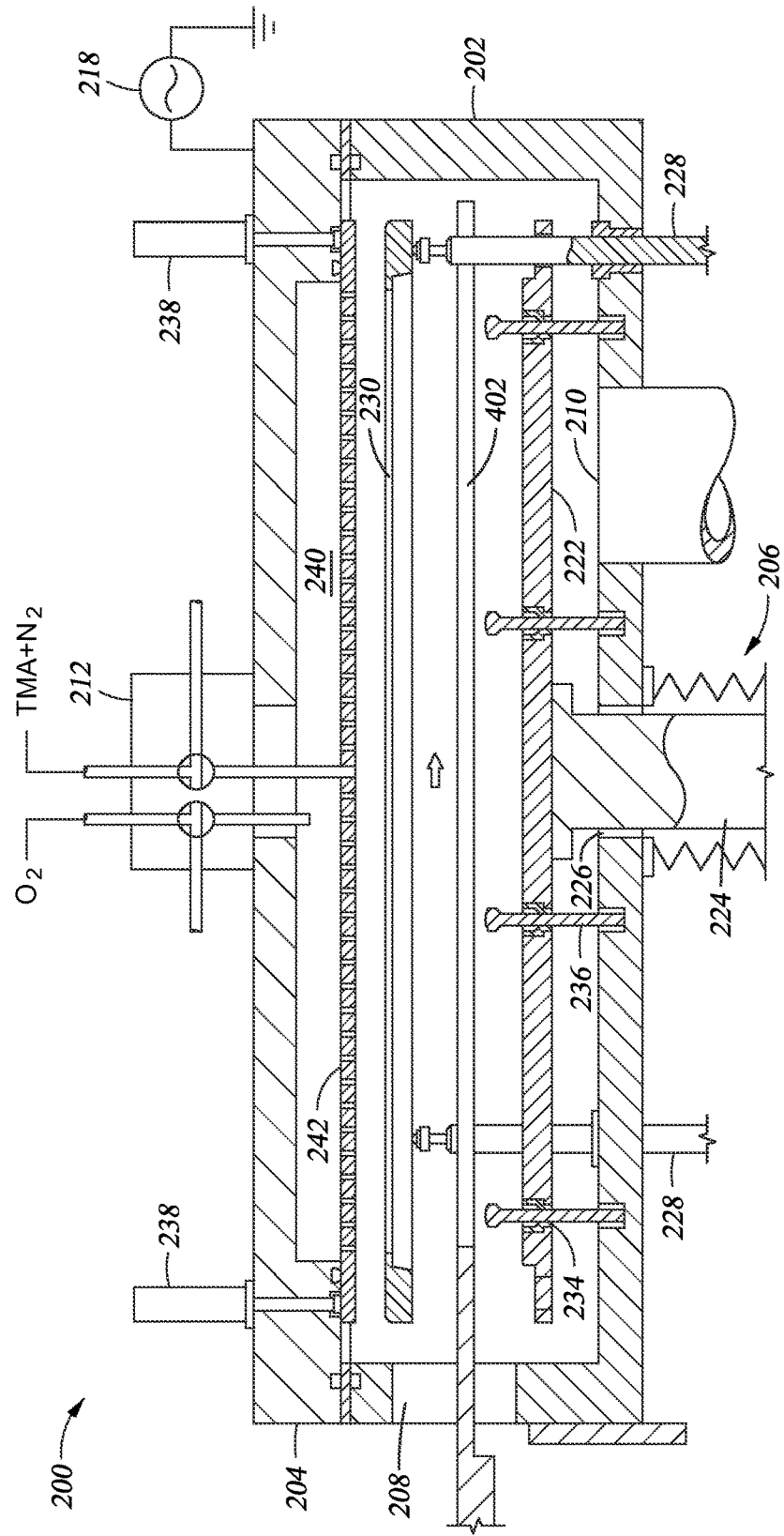
FIG. 4 illustrates an exemplary chamber for ALD, with components in a position in preparation for cleaning, according to certain aspects of the present disclosure.

Still referring to FIG. 2, the susceptor 222 can include one or more bores 234 through the susceptor to accommodate one or more lift pins 236. Each lift pin is typically constructed of ceramic or ceramic-containing materials, and is used for substrate-handling and transport. Each lift pin 236 is mounted so that they may slide freely within a bore 234. In one aspect, each bore 234 is lined with a ceramic sleeve to help the lift pins 236 to freely slide. Each lift pin 236 is moveable within its respective bore 234 by contacting the chamber body 202 when the support assembly 206 is lowered, as shown in FIGS. 4-6. The support assembly 206 is movable such that the upper surface of the lift pin 236 can be located above the substrate support surface of the susceptor 222 when the support assembly is in a lower position. Conversely, the upper surface of the lift pins 236 is located below the upper surface of the susceptor 222 when the support assembly is in a raised position. Thus, part of each lift pin 236 passes through a respective bore 234 in the susceptor 222 when the support assembly moves from a lower position to an upper position, and vice-versa.

When contacting the chamber body 202, the lift pins 236 push against a lower surface of the substrate 232, lifting the substrate 232 off the susceptor 222. Conversely, the susceptor 222 may raise the substrate 232 off of the lift pins 236. The lift pins 236 can include enlarged upper ends or conical heads to prevent the lift pins 236 from falling out from the susceptor 222. Other pin designs can also be utilized and are well known to those skilled in the art.

In one embodiment, one or more of the lift pins 236 include a coating or an attachment disposed thereon that is made of a non-skid or highly frictional material to prevent the substrate 232 from sliding when supported thereon. A preferred material is a heat-resistant, polymeric material that does not scratch or otherwise damage the backside of the substrate 232, which would create contaminants within the processing chamber 200.

Referring back to FIG. 2, the susceptor 222 can be moved vertically within the chamber body 202 so that a distance between the susceptor 222 and the showerhead 242 can be controlled. An optical or other sensor (not shown) can provide information concerning the position of the susceptor 222 within the chamber 200.

The processing chamber 200 may further comprise one or more showerhead actuators 238. The showerhead actuators may be connected to the showerhead 242. The showerhead actuators 238 may raise or lower the showerhead 242 for removal or replacement of the showerhead 242 (e.g., for cleaning or other purposes), as shown in FIG. 6.

Figure 3:
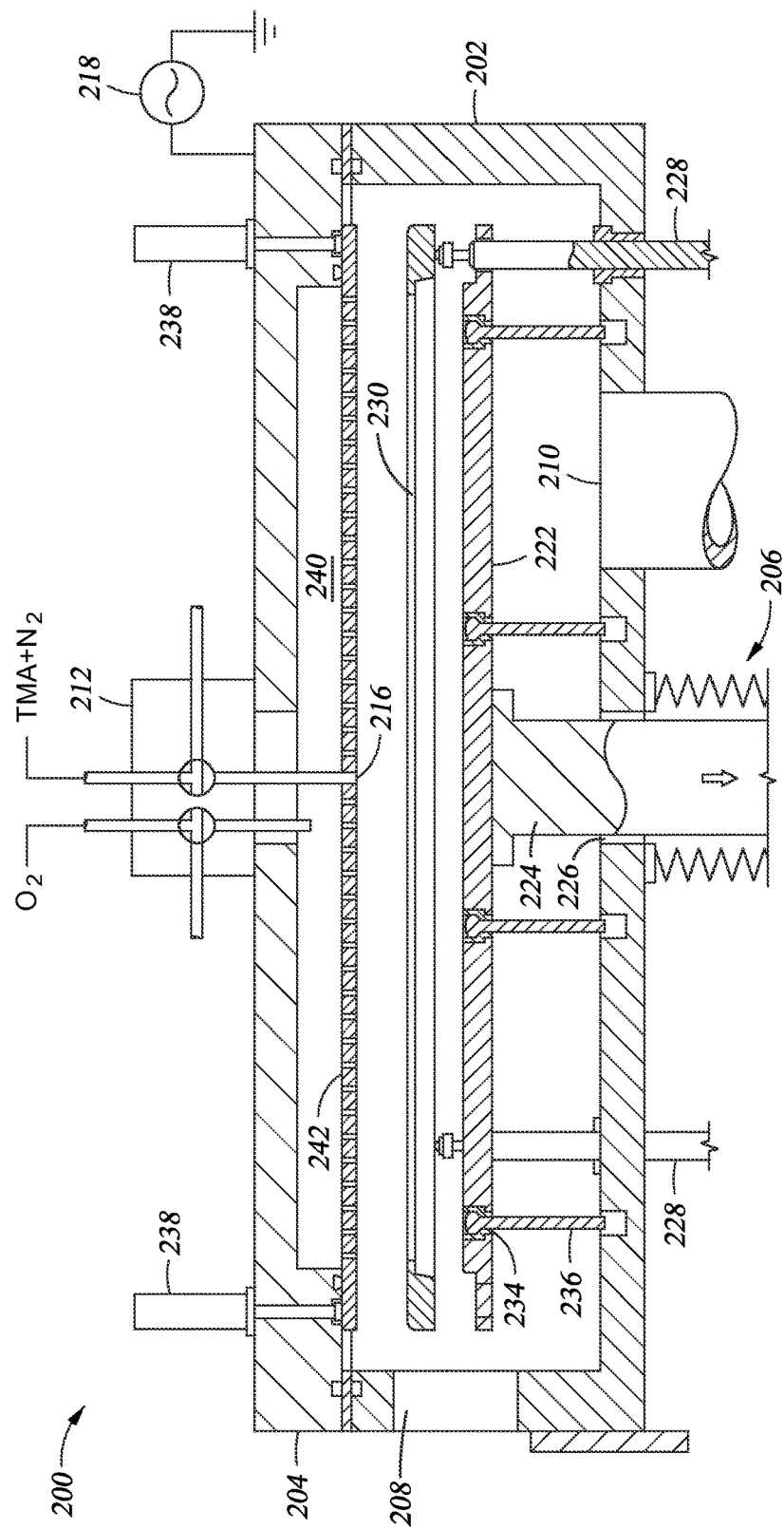
FIG. 3 illustrates an exemplary chamber for ALD, with components in a position in preparation for cleaning, according to certain aspects of the present disclosure.

The process for removing the mask 230 and showerhead 242 from the processing chamber 200 for cleaning without taking the chamber off-line will now be described. Referring to FIG. 2, the processing chamber begins with the susceptor 222 in the process position. The removal process begins with lowering the substrate support assembly 206 by means of the substrate lift mechanism (not shown) lowering the shaft(s) 224. The susceptor 222 lowers the mask 230 until the mask 230 contacts the mask alignment shafts 228, which remain in a raised position, as illustrated in FIG. 3. The showerhead actuators 238 are not activated, and the showerhead remains in a process position. This may be described as the "mask drop position."

FIG. 4 illustrates the next step in the removal process. The substrate support assembly 206 continues lowering until it reaches its lowest position, as shown in FIG. 4. This may be known as the "robot entry position." Mask 230 remains resting on mask alignment shafts 228. A robot blade 402 or other robotic tool enters the processing chamber 200 through the slit valve opening 208, and is positioned below the mask by the handling robot (see FIG. 1). The robot blade has a plurality of slots (not shown) in it, allowing it to reach past the mask alignment shafts and lift pins 236. That is, the robot blade or other robotic tool has slots that may be aligned with the mask alignment shafts and lift pins so that the robot blade or other robotic tool can be inserted in the processing chamber below the mask without impacting the mask alignment shafts and lift pins.

FIG. 5 illustrates the position of the items in the processing chamber 200 immediately before removal of the mask 230 from the chamber. The mask alignment shafts 228 are lowered by the mask lift mechanism (not shown). When the mask alignment shafts are low enough, the mask contacts the robot blade 402. The mask alignment shafts continue withdrawing until they are completely clear of the mask. This may be known as the "mask removal position." At this point, the handling robot (see FIG. 1) withdraws the robot blade and the mask. The handling robot may place the mask within the mask chamber (see FIG. 1) for removal of the mask from the processing system. The mask can then be removed from the mask chamber for cleaning without breaking vacuum of the other chambers of the processing system.

FIG. 6 illustrates the final position of the items in the processing chamber 200 before removal of the showerhead 242. After removal of the mask (not shown in FIG. 6), the handling robot (see FIG. 1) introduces a robot blade 602 or other robotic tool through the slit valve opening 208. The robot blade 602 may be the same robot blade 402 shown in FIGS. 4 and 5, but this is not required. The showerhead actuators 238 then activate, lowering the showerhead onto the robot blade. After lowering the showerhead onto the robot blade, the actuators disconnect from the showerhead by means of couplings (not shown). The couplings may be electrostatic or mechanical couplings, for example. This may be known as the "showerhead removal position." After the showerhead is resting on the robot blade and the actuators have disconnected from the showerhead, the handling robot may withdraw the robot blade and the showerhead (e.g., for cleaning). The handling robot may place the showerhead within the mask chamber (see FIG. 1) for removal of the showerhead from the processing system. Similar to the movement of the mask described with reference to FIG. 5, the showerhead can be removed from the mask chamber for cleaning without breaking vacuum of the other chambers of the processing system.

A processing system 100 as described above, allows removal of a mask, showerhead, and other process tools from the processing system without breaking vacuum on several of the processing chambers. Thus, the process tools, which can accumulate unwanted deposits from being exposed to the CVD and/or ALD processes, can be removed from the processing chambers for cleaning while the processing chambers remain at process pressures (e.g., 500 to 700 mTorr). Other process tools can also be placed in the processing chambers without breaking vacuum in the processing chambers. Because the process tools can be replaced without breaking vacuum in the processing chambers, processing can continue after process tool replacement more quickly in the processing chambers as compared to processing chambers which cannot have their process tools replaced without breaking vacuum. Processing can continue more quickly after process tool replacement because the processing chambers are already evacuated and do not need to be pumped down from atmospheric pressure (e.g., 760 Torr) after process tool replacement. In addition, there is a reduced chance of contamination of the processing chambers during process tool replacement, as the processing chambers are not exposed to atmospheric air and other contaminants during the process tool replacement.

The process controller described above with reference to FIG. 1 can operate under the control of a computer program stored on a hard disk drive of a computer. For example, the computer program can dictate the process sequencing and timing, mixture of gases, chamber pressures, RF power levels, susceptor positioning, slit valve opening and closing, and other parameters of a particular process.

To provide a better understanding of the foregoing discussion, the above non-limiting examples are offered. Although the examples may be directed to specific embodiments, the examples should not be interpreted as limiting the invention in any specific respect.

Unless otherwise indicated, all numbers expressing quantities of ingredients, properties, reaction conditions, and so forth, used in the specification and claims are to be understood as approximations. These approximations are based on the desired properties sought to be obtained by the present invention, and the error of measurement, and should at least be construed in light of the number of reported significant digits and by applying ordinary rounding techniques. Further, any of the quantities expressed herein, including temperature, pressure, spacing, molar ratios, flow rates, and so on, can be further optimized to achieve the desired layer and particle performance.

While the foregoing is directed to embodiments of the present invention, other and further embodiments of the invention may be devised without departing from the basic scope thereof, and the scope thereof is determined by the claims that follow.

The invention claimed is:

1. A processing chamber for atomic layer deposition (ALD), comprising:
a gas distribution plate disposed in the chamber;
a slit valve opening configured to permit passage of the gas distribution plate;
a substrate support disposed in the chamber opposite the gas distribution plate; and
at least one gas distribution plate actuator coupled to the gas distribution plate, wherein:
the at least one gas distribution plate actuator is operable to move the gas distribution plate to a first position wherein the gas distribution plate separates a plenum in a portion of the interior of the processing chamber from another portion of the interior of the processing chamber, and
the at least one gas distribution plate actuator is operable to move the gas distribution plate to a second position aligned with the slit valve opening, wherein the gas distribution plate is horizontally removable from the chamber via the slit valve opening.

2. The processing chamber of claim 1, wherein the gas distribution plate includes a central hole, the chamber further comprising:
a first gas source coupled to the chamber to deliver a first gas through the central hole in the gas distribution plate; and
a second gas source coupled to the chamber to deliver a second gas to the chamber through a location different from the central hole.

3. The processing chamber of claim 1, further comprising a mask disposed between the gas distribution plate and the substrate support.

4. The processing chamber of claim 1, further comprising a radio frequency (RF) power source coupled to the gas distribution plate.

5. The processing chamber of claim 2, further comprising a mask disposed between the gas distribution plate and the substrate support.

6. A processing system for performing thin film encapsulation, comprising:
a first processing chamber having a slit valve opening configured to permit passage of first process tools therethrough;
a first slit valve operable to open and close the slit valve opening of the first processing chamber, wherein the first slit valve is operable to make an air-tight seal when closed;
a second processing chamber having a slit valve opening configured to permit passage of second process tools therethrough;
a second slit valve operable to open and close the slit valve opening of the second processing chamber, wherein the second slit valve is operable to make an air-tight seal when closed;
an atomic layer deposition (ALD) processing chamber, wherein pressure within the ALD processing chamber is maintained at 1 torr or less and the ALD processing chamber has a slit valve opening configured to permit passage of ALD process tools therethrough, wherein the ALD process tools comprise a first gas distribution plate;
at least one gas distribution plate actuator coupled to the first gas distribution plate, wherein:
the at least one gas distribution plate actuator is operable to move the first gas distribution plate to a first position wherein the first gas distribution plate separates a plenum in a portion of the interior of the ALD processing chamber from another portion of the interior of the ALD processing chamber, and
the at least one gas distribution plate actuator is operable to move the first gas distribution plate to a second position aligned with the slit valve opening of the ALD processing chamber, wherein the first gas distribution plate is horizontally removable from the chamber via the slit valve opening;

a third slit valve operable to open and close the slit valve opening of the ALD processing chamber, wherein the third slit valve is operable to make an air-tight seal when closed;

a mask chamber having a transfer slit valve opening configured to permit passage of first process tools, second process tools, and ALD process tools therethrough and a loading doorway configured to permit passage of first process tools, second process tools, and ALD process tools therethrough;

a fourth slit valve operable to open and close the transfer slit valve opening of the mask chamber, wherein the fourth slit valve is operable to make an air-tight seal when closed;

a load-lock chamber having a transfer slit valve opening and a loading slit valve opening;

a fifth slit valve operable to open and close the transfer slit valve opening of the load-lock chamber, wherein the fifth slit valve is operable to make an air-tight seal when closed;

a sixth slit valve operable to open and close the loading slit valve opening of the load-lock chamber, wherein the sixth slit valve is operable to make an air-tight seal when closed;

a door operable to open and close the loading doorway of the mask chamber, wherein the door is operable to make an air-tight seal when closed; and a transfer chamber having a first slit valve opening configured to permit passage of process tools therethrough and aligned to the slit valve opening of the first processing chamber, a second slit valve opening configured to permit passage of process tools therethrough and aligned to the slit valve opening of the second processing chamber, a third slit valve opening configured to permit passage of ALD process tools therethrough and aligned to the slit valve opening of the ALD processing chamber, a fourth slit valve opening aligned to the transfer slit valve opening of the load-lock chamber, and a fifth slit valve opening configured to permit passage of ALD process tools and non-ALD process tools and aligned to the transfer slit valve opening of the mask chamber.

7. The processing system of claim 6, wherein the ALD process tools comprise a second gas distribution plate.

8. The processing system of claim 7, further comprising:
a robotic tool operable to move the first gas distribution plate from the ALD chamber to the transfer chamber via the third slit valve opening and move the second gas distribution plate from the transfer chamber to the ALD chamber via the third slit valve opening.

9. The processing system of claim 8, further comprising:
at least one gas distribution plate actuator operable to remove the first gas distribution plate from a process position in the ALD chamber and move the second gas distribution plate into a process position in the ALD chamber.

10. The processing system of claim 6, wherein the ALD process tools comprise a first mask and a second mask.

11. The processing system of claim 10, further comprising:
a robotic tool operable to move the first mask from the ALD chamber to the transfer chamber via the third slit valve opening and move the second mask from the transfer chamber to the ALD chamber via the third slit valve opening.

12. The processing system of claim 6, wherein the first processing chamber comprises a plasma-enhanced chemical vapor deposition (PE-CVD) chamber.

13. The processing system of claim 12, wherein the first process tools comprise a gas distribution plate.

14. The processing system of claim 6, further comprising:
a robotic tool operable to move a substrate and a mask from the first processing chamber to the transfer chamber via the first slit valve opening and from the transfer chamber to the ALD processing chamber via the third slit valve opening.

15. The processing system of claim 14, wherein the robotic tool is operable to move the substrate and the mask from the ALD processing chamber to the transfer chamber via the third slit valve opening and from the transfer chamber to the second processing chamber via the second slit valve opening.

16. The processing system of claim 15, wherein the robotic tool is operable to move the substrate from the transfer chamber to the load-lock chamber via the fourth slit valve opening and move the mask from the transfer chamber to the mask chamber via the fifth slit valve opening.

17. The processing chamber of claim 5, further comprising a radio frequency (RF) power source coupled to the gas distribution plate.

18. The processing chamber of claim 6, further comprising an RF power source coupled to the gas distribution plate.

19. The processing system of claim 11, further comprising:
a substrate support assembly operable to remove the first mask from a process position in the ALD chamber and operable to move the second mask into a process position in the ALD chamber.

20. The processing system of claim 13, further comprising:
a robotic tool operable to move the gas distribution plate from the first processing chamber to the transfer chamber via the first slit valve opening.

* * * * *